United States Patent [19]
Codama et al.

[11] Patent Number: 5,627,364
[45] Date of Patent: May 6, 1997

[54] LINEAR ARRAY IMAGE SENSOR WITH THIN-FILM LIGHT EMISSION ELEMENT LIGHT SOURCE

[75] Inventors: Mitsufumi Codama, Kanagawa; Michio Arai, Tokyo, both of Japan

[73] Assignees: TDK Corporation, Tokyo; Semiconductor Energy Laboratory Co., Ltd., Kanagawa, both of Japan

[21] Appl. No.: 541,871

[22] Filed: Oct. 10, 1995

[30] Foreign Application Priority Data

Oct. 11, 1994 [JP] Japan ................... 6-245162
Oct. 12, 1994 [JP] Japan ................... 6-245841
Oct. 18, 1994 [JP] Japan ................... 6-252028

[51] Int. Cl.⁶ ................... H01L 27/146; H05B 33/00
[52] U.S. Cl. ................... 250/208.1; 358/482; 257/40; 257/443
[58] Field of Search ................... 250/208.1, 214.1, 250/214 R; 358/454, 482, 483, 496; 257/40, 59, 431, 432, 443, 447

[56] References Cited

U.S. PATENT DOCUMENTS

| | | | |
|---|---|---|---|
| 5,014,100 | 5/1991 | Fukada et al. | 257/432 |
| 5,105,238 | 4/1992 | Nikaido et al. | 257/40 |
| 5,187,596 | 2/1993 | Hwang | 250/208.1 |
| 5,324,928 | 6/1994 | Saika et al. | 250/208.1 |

FOREIGN PATENT DOCUMENTS

| | | |
|---|---|---|
| 57-11472 | 3/1982 | Japan. |
| 62-11545 | 3/1987 | Japan. |

*Primary Examiner*—Edward P. Westin
*Assistant Examiner*—John R. Lee
*Attorney, Agent, or Firm*—Naikaido, Marmelstein, Murraay & Oram LLP

[57] ABSTRACT

A linear array image sensor with a light source, includes a first substrate made of a transparent plate, which has a first surface and a second surface, at least one thin-film light emission element disposed on the first surface of the first substrate and linearly elongated in a direction, a second substrate having two surfaces, and a plurality of solid-state image pickup elements disposed on one of the two surfaces of the second substrate and linearly aligned along the elongated direction of the thin-film light emission element. The first and second substrates are fixed to and integrated with each other by a transparent material so that light originated by the thin-film light emission element is emitted from the second surface of the first substrate and reflected by an image carrier to be detected, and that the reflected light is applied to the plurality of solid-state image pickup elements through the first substrate.

24 Claims, 13 Drawing Sheets

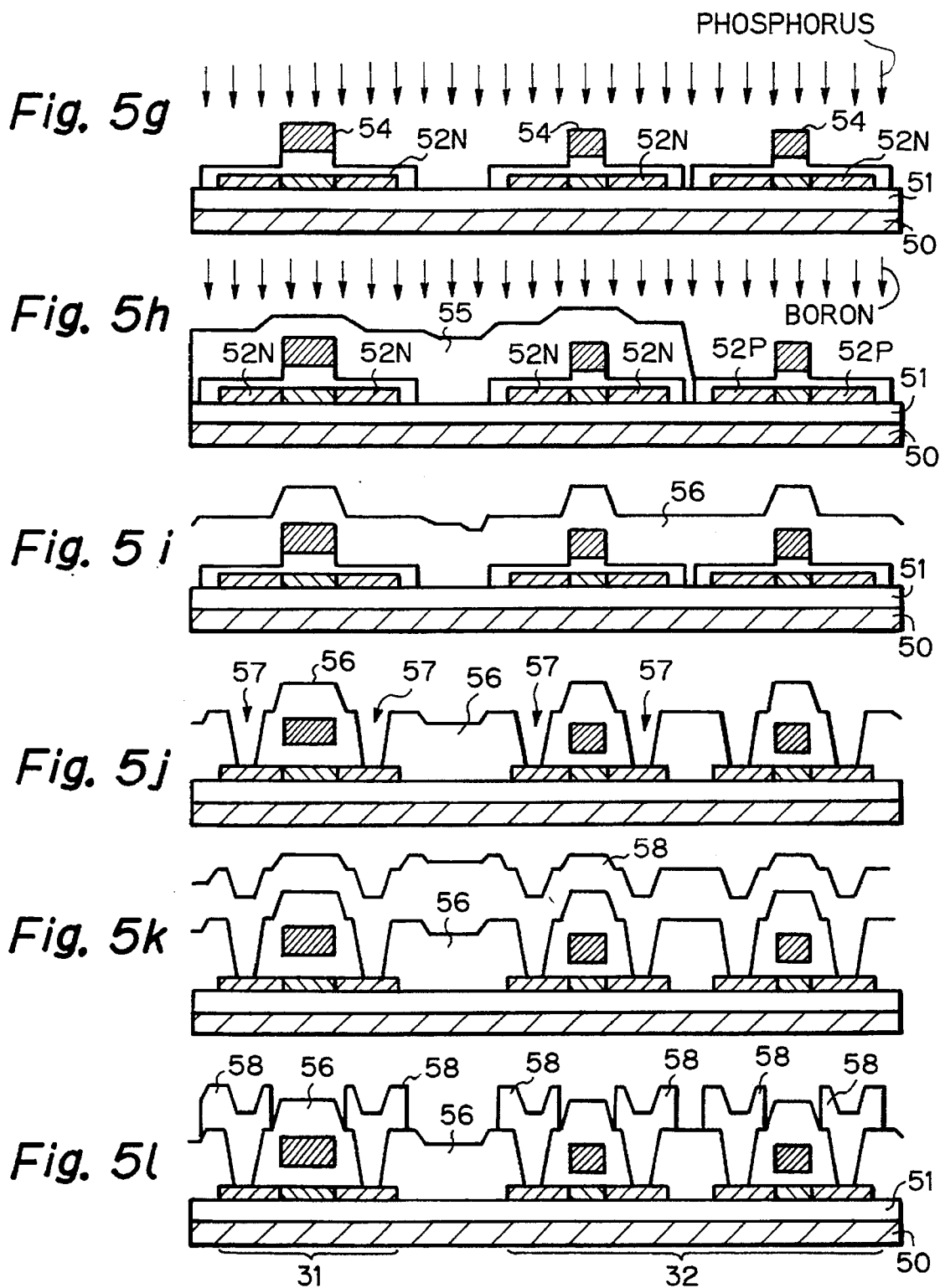

LINEAR ARRAY IMAGE SENSOR WITH THIN-FILM LIGHT EMISSION ELEMENT LIGHT SOURCE

FIELD OF THE INVENTION

The present invention relates to a linear array image sensor with a linear light source, used for example in a facsimile, an electronic copying machine, or an image scanner.

DESCRIPTION OF THE RELATED ART

It has been expected that a facsimile, an electronic copying machine, and an image scanner are designed and manufactured with smaller dimension, lighter weight and lower cost. Thus, linear array image sensors utilized in these devices have to be designed and manufactured in smaller dimension, lighter weight and lower cost.

For the linear array image sensor, there are three types, i.e. non-contact type, semi-contact and full-contact type.

The non-contact type image sensor with CCD (Charge Coupled Device) is most popularly utilized and is advantageous in lower cost. This is because it can be manufactured in an LSI production process using silicon wafers and uses CCD chip which can be made in relatively small size. However, since this image sensor is designed to project an image of an original onto the CCD via a reduction lens system, it will have larger dimension and heavier weight than the other two types of image sensors.

The semi-contact type image sensor can be easily formed in a smaller dimension than the non-contact type because it needs no reduction optical system, and thus has been gradually utilized in this field. However, this image sensor is somewhat expensive. Also, since a SELFOC lens array for projecting an image of an original onto a solid-state image pickup element and an (LED) Light Emitting Diode array as a light source are utilized in this image sensor, it will needs at least a certain degree of width and thickness (about 15 mm).

The full-contact type image sensor can be made in a smaller size than the semi-contact type image sensor, and also can be easily assembled because it needs no SELFOC lens array nor adjustment of optical position of its image pickup elements. However, it will need a certain degree of thickness corresponding to the LED array as well as the semi-contact type image sensor. Also, since, in this type image sensor, it is necessary to project light to an original through a substrate on which solid-state image pickup elements are arranged, this substrate has to be made by a transparent material. Therefore, CCD elements which are in general formed on a silicon wafer and also solid-state image pickup elements formed on a nontransparent substrate such as an alumina substrate cannot be used in the full-contact type image sensor.

Hereinafter, constitutions of conventional image sensors will be described with reference to drawings.

FIG. 1 is an oblique view illustrating a part of a conventional semi-contact type image sensor. As shown in the figure, an LED house 11, a SELFOC lens array 12 and a substrate 13 on which solid-state image pickup elements (not shown) are formed are mounted in a housing 10. The light emitted from the LED house 11 is reflected by an original (not shown) located above the housing 10, and the reflected light is applied to the solid-state image pickup elements formed on the substrate 13 through the SELFOC lens array 12.

Since this semi-contact type image sensor uses the SELFOC lens array 12 for projecting an image of the original onto the image pickup elements and the LED array 11 as a light source, its thickness and width W will become certain degrees as shown in FIG. 1.

FIG. 2 is an oblique view illustrating a part of a conventional full-contact type image sensor. As shown in the figure, a substrate 23 having a slit-shaped window 25 for passing a light is disposed on a housing 20. On the substrate 23, solid-state image pickup elements 24 are formed. An LED house 21 is attached to a bottom surface of the housing 20 at a position of the window 25. The light emitted from the LED house 21 passes through the slit-shaped window 25 of the substrate 23 and is reflected by an original (not shown) located above the substrate 23, and then the reflected light is applied to the solid-state image pickup elements 24 formed on the substrate 23. As will be understood, this full-contact type image sensor needs a certain degree of thickness T which corresponds to that of the LED house 21.

As described herein before, the conventional non-contact type image sensor cannot be formed in a small dimension and in a light weight due to usage of a reduction lens system, the conventional semi-contact type image sensor cannot be formed so small due to its LED house for the light source, and the conventional full-contact type image sensor cannot be formed so thin due to its LED house and also has to use a transparent substrate for forming solid-state image pickup elements.

SUMMARY OF THE INVENTION

It is therefore an object of the present invention to provide a low cost linear array image sensor with a very small dimension.

Another object of the present invention is to provide a linear array image sensor with solid-state image pickup elements which can be manufactured even on a nontransparent substrate.

According to the present invention, the above-mentioned objects can be achieved by a linear array image sensor with a light source, including a first substrate made of a transparent plate, which has a first surface and a second surface, at least one thin-film light emission element disposed on the first surface of the first substrate and linearly elongated in a direction, a second substrate having two surfaces, and a plurality of solid-state image pickup elements disposed on one of the two surfaces of the second substrate and linearly aligned along the elongated direction of the thin-film light emission element. The first and second substrates are fixed to and integrated with each other by a transparent material so that light originated by the thin-film light emission element is emitted from the second surface of the first substrate and reflected by an image carrier to be detected, and that the reflected light is applied to the plurality of the solid-state image pickup elements through the first substrate.

In the specification, "an image carrier to be detected" means any carrier having an image which is to be detected, for example, such as an original of paper or another material other than paper, on which document, character, graphic and/or image are displayed.

The dimension of the image sensor is mainly restricted by the dimension of its optical system such as a lens and a light source. Thus, if the optical system itself is downsized, whole dimension of the image sensor will become smaller. Furthermore, the cost of the optical system accounts for a great amount of the whole fabrication cost of the image sensor as well as that of the solid-state image pickup elements. Thus, cost-down of the optical system will result the whole fabrication cost of the sensor to reduce.

According to this invention, since the solid-state image pickup elements and the light emission element are formed as thin-film components and are fixed and integrated with each other, its chip size can be extremely reduced. Thus, a low cost linear array image sensor of full-contact type can be fabricated with a very small dimension.

Also, according to this invention, since the second substrate for the image pickup elements can be formed even by nontransparent material, a lower cost linear array image sensor can be fabricated by using a cheaper material.

Furthermore, since the light emission element constitutes a surface illuminant, not a point source like as an LED, it is possible to uniformly illuminate the image carrier.

It is preferred that the first and second substrates are integrated by the transparent material so that the first surface of the first substrate and the one surface of the second substrate are in parallel and opposed to with each other.

It is also preferred that the transparent material is a transparent adhesive inserted between the first and second substrates.

The first substrate may have a thickness of 50 to 200 µm, and in operation a surface of the image carrier is kept in contact with the second surface of the first substrate.

In an modification of the present invention, the sensor may further include a distributed index lens array such as a SELFOC lens array arranged outside the second surface of the first substrate along the elongated direction of the thin-film light emission element so that light originated by the thin-film light emission element is emitted from the second surface of the first substrate, passed through the distributed index lens array and reflected by an image carrier to be detected, and that the reflected light is applied to the plurality of the solid-state image pickup elements through the distributed index lens array and the first substrate. As a result, a cheaper transparent plate not a thin glass plate which will be expensive can be used as the first substrate.

Preferably, the thin-film light emission element is constituted by an organic EL (Electro-Luminescent) element.

According to the present invention, the above-mentioned objects can be also achieved by a linear array image sensor with a light source, including a first substrate made of a transparent plate, which has a first surface and a second surface, two thin-film light emission elements disposed on the first surface of the first substrate and linearly elongated in parallel in a direction to form a slit-shaped window between them, a second substrate having two surfaces, and a plurality of solid-state image pickup elements disposed on one of the two surfaces of the second substrate and linearly aligned along the elongated direction of the thin-film light emission elements. The first and second substrates are fixed to and integrated with each other by a transparent material so that light originated by the thin-film light emission elements is emitted from the second surface of the first substrate and reflected by an image carrier to be detected, and that the reflected light is applied to the plurality of the solid-state image pickup elements through the first substrate and the slit-shaped window.

According to this invention, since the solid-state image pickup elements and the light emission element are formed as thin-film components and are fixed and integrated with each other, its chip size can be extremely reduced. Thus, a low cost linear array image sensor of full-contact type can be fabricated with a very small dimension.

Also, according to this invention, since a part of the thin-film light emission elements shade the light, no additional light-shield layer is necessary for protecting the circuits on the second substrate from light incidence and for preventing stray light from being applied to the image pickup elements.

In addition, since the second substrate for the image pickup elements can be formed even by nontransparent material, a lower cost linear array image sensor can be fabricated by using a cheaper material.

Furthermore, since the light emission element constitutes a surface illuminant, not a point source like as an LED, it is possible to uniformly illuminate the image carrier.

It is preferred that the first and second substrates are integrated by the transparent material so that the first surface of the first substrate and the one surface of the second substrate are in parallel and opposed to with each other.

It is also preferred that the transparent material is a transparent adhesive inserted between the first and second substrates.

The first substrate may have a thickness of 50 to 200 µm, and in operation a surface of the image carrier is kept in contact with the second surface of the first substrate.

In an modification of the present invention, the sensor may further include a distributed index lens array such as a SELFOC lens array arranged outside the second surface of the first substrate along the elongated direction of the thin-film light emission element so that light originated by the thin-film light emission element is emitted from the second surface of the first substrate, passed through the distributed index lens array and reflected by an image carrier to be detected, and that the reflected light is applied to the plurality of the solid-state image pickup elements through the distributed index lens array, the first substrate and the slit-shaped window. As a result, a cheaper transparent plate not a thin glass plate which will be expensive can be used as the first substrate.

Preferably, the thin-film light emission elements are constituted by organic EL elements.

According to the present invention, the above-mentioned objects can be also achieved by a linear array image sensor with a light source, including a first substrate made of a transparent plate, which has a first surface, a second surface and a plurality of side surfaces, at least one thin-film light emission element disposed on the first surface of the first substrate and linearly elongated in a direction, a second substrate having two surfaces, a plurality of solid-state image pickup elements disposed on one of the two surfaces of the second substrate and linearly aligned along the elongated direction of the thin-film light emission element, and a reflector layer for covering at least one of the plurality of side surfaces of the first substrate. The first and second substrates are fixed to and integrated with each other so that light originated by the thin-film light emission element is partially reflected by the reflector layer, emitted from the second surface of the first substrate and reflected by an image carrier to be detected, and that the reflected light is applied to the plurality of the solid-state image pickup elements.

According to this invention, since the side surfaces of the first substrate on the first surface of which the light emission element is formed are covered by the reflector layer, it is possible to effectively illuminate the image carrier.

In addition, since the light emission element constitutes a surface illuminant, not a point source like as an LED, it is also possible to uniformly illuminate the image carrier without using a diffuser or a diffusing lens.

Furthermore, according to this invention, since the first substrate on which the light emission element is disposed and the second substrate on which the image pickup elements are disposed are fixed to and integrated with each other, a low cost linear array image sensor of full-contact type can be fabricated with a very small dimension. Particularly, since the light emission element can be formed on the first substrate in flat, the first and second substrates can be integrated with each other in flat causing dimension of the image sensor to extremely decrease.

Also, since the second substrate for the image pickup elements can be formed even by nontransparent material, a lower cost linear array image sensor can be fabricated by using a cheaper material.

It is preferred that the first and second substrates are fixed to and integrated with each other by standing side by side so that the second surface of the first substrate and the one surface of the second substrate are substantially in a plane.

It is also preferred that the sensor further includes a transparent thin plate which is positioned above the first and second substrates and fixed to and integrated with the first and second substrates in parallel by a transparent material.

Preferably, the transparent material is a transparent adhesive inserted between the transparent thin plate and the first and second substrates.

The transparent thin plate may have a thickness of 50 to 200 µm, and in operation a surface of the image carrier is kept in contact with the second surface of the first substrate.

Preferably, the thin-film light emission element is constituted by an organic EL element.

According to the present invention, the above-mentioned objects can be achieved by a linear array image sensor with a light source, including a first substrate made of a transparent plate, which has a first surface, a second surface and a plurality of side surfaces, at least one thin-film light emission element disposed on the first surface of the first substrate and linearly elongated in a direction, a second substrate made of a transparent plate, which has a first surface and a second surface, a least one light-shield layer disposed on the first surface of the second substrate and linearly extending along the elongated direction of the thin film light emission element, the light-shield layer having a slit-shaped window extending along the elongated direction, a plurality of solid-state image pickup elements disposed on the light-shield layer and linearly aligned along the elongated direction, and a reflector layer for covering at least one of the plurality of side surfaces of the first substrate. The first and second substrates are fixed to and integrated with each other so that light originated by the thin-film light emission element is partially reflected by the reflector layer, emitted from the second surface of the first substrate, passed through the second substrate and the slit-shaped window of the light-shield layer and reflected by an image carrier to be detected, and that the reflected light is applied to the plurality of the solid-state image pickup elements.

According to this invention, since the side surfaces of the first substrate on the first surface of which the light emission element is formed are covered by the reflector layer, it is possible to effectively illuminate the image carrier.

In addition, since the light emission element constitutes a surface illuminant, not a point source like as an LED, it is also possible to uniformly illuminate the image carrier without using a diffuser or a diffusing lens.

Also, since the image carrier is illuminated by a slit light passing through the slit-shaped window in the light-shield layer, optical resolution of the image sensor can be extremely improved.

Furthermore, according to this invention, since the first substrate on which the light emission element is disposed and the second substrate on which the image pickup elements are disposed are fixed to and integrated with each other, a low cost linear array image sensor of full-contact type can be fabricated with a very small dimension.

Also, since the second substrate for the image pickup elements can be formed even by nontransparent material, a lower cost linear array image sensor can be fabricated by using a cheaper material.

It is preferred that the first and second substrates are integrated with each other by fixing the second surface of the first substrate to the second surface of the second substrate.

It is also preferred that the sensor further includes a transparent thin plate which is positioned above the first and second substrates and fixed to and integrated with the first and second substrates in parallel by a transparent material.

Preferably, the transparent material is a transparent adhesive inserted between the transparent thin plate and the first and second substrates.

The transparent thin plate may have a thickness of 50 to 200 µm, and in operation a surface of the image carrier is kept in contact with the second surface of the first substrate.

Preferably, the thin-film light emission element is constituted by an organic EL element.

Further objects and advantages of the present invention will be apparent from the following description of the preferred embodiments of the invention as illustrated in the accompanying drawings.

BRIEF DESCRIPTION OF THE DRAWINGS

FIGS. 5a to 5l show processes of fabricating solid-state image pickup elements and their drive circuits in the embodiment of FIG. 3;

DESCRIPTION OF THE PREFERRED EMBODIMENTS

Figure 3:
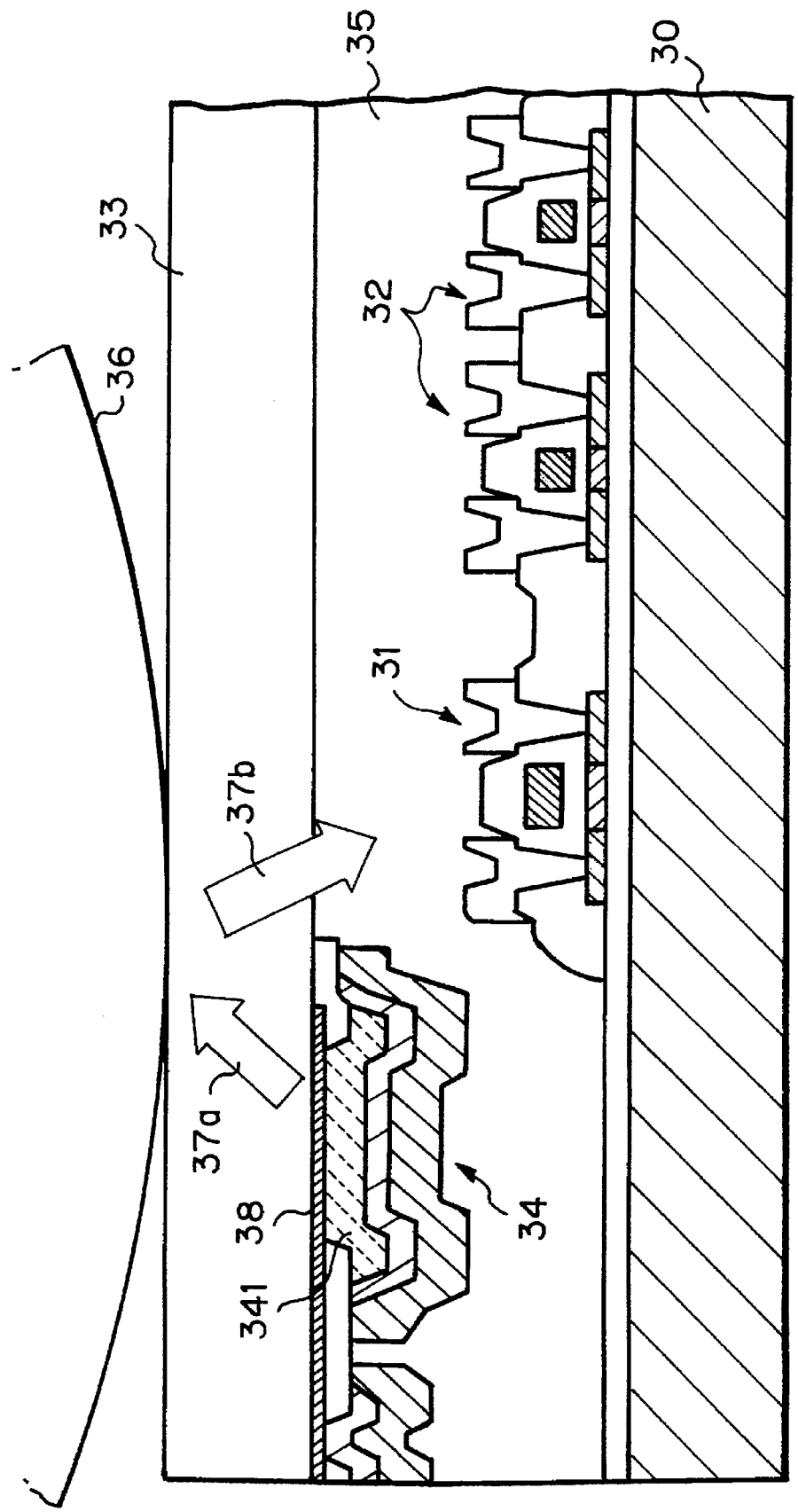
FIG. 3 is a sectional view illustrating a partial constitution of a preferred embodiment of a linear array image sensor according to the present invention.

FIG. 3 illustrates a partial constitution of a preferred embodiment of a linear array image sensor according to the present invention. This image sensor is a full-contact type linear array image sensor.

As shown in the figure, on one surface of a substrate 30, a large number of solid-state image pickup elements (photoelectric conversion elements) 31 and a large number of reading drive circuits 32 for the respective image pickup elements 31 are linearly formed. The substrate 30 is made of for example glass, quartz, ceramics ($Al_2O_3$) or silicon (monocrystal or polycrystal).

On one surface of a transparent substrate 33 constituted by a thin glass plate, a single thin-film light emission element 34 such as an organic EL (Electro-Luminescent) element is linearly formed along the many image pickup elements 31 on the substrate 30. The thin-film light emission element 34 can be formed by an inorganic EL element. The substrate 30 and the transparent substrate 33 are fixed to and integrated with each other in parallel by a transparent adhesive 35 such as for example an epoxy adhesive or an ultraviolet-curing adhesive so that the surface of the substrate 30 on which the image pickup elements 31 are formed and the surface of the transparent substrate 33 on which the EL element 34 is formed oppose to each other.

In operation, an original 36 with images to be read out is kept in contact with the other surface of the transparent substrate 33. Light 37a from a light emission layer 343 of the EL element 34 is applied to the surface of the original 36 via a transparent electrode 38 and the transparent substrate 33, and reflected light 37b from the surface of the original 36 is applied to the image pickup elements 31 via the transparent substrate 33 and the transparent adhesive 35 so as to be converted into electrical signals. The converted electrical signals are then inputted into the reading drive circuits 32 so as to provide image signals with levels corresponding upon the gradation of the original 36.

Figure 4:
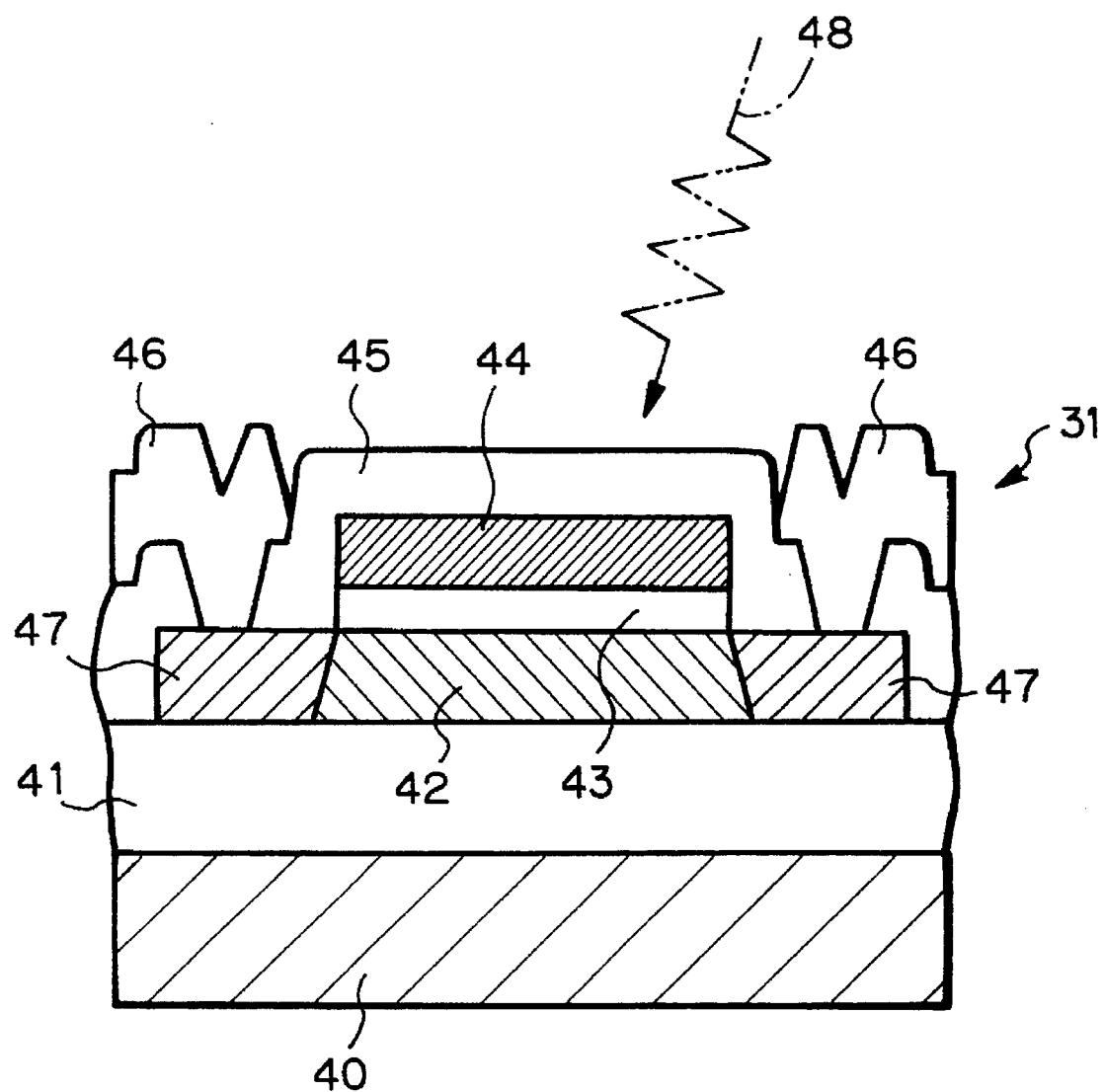
FIG. 4 is a sectional view illustrating a partial structure of phototransistors in the embodiment of FIG. 3.

FIG. 4 illustrates a partial structure of phototransistors which are used as the solid-state image pickup elements 31 in this embodiment. In the figure, reference numeral 40 denotes the aforementioned substrate (30), and 41 denotes an insulator layer. If the substrate 40 is made of silicon, this layer 41 will be formed by heat-treating this silicon substrate. In FIG. 4, furthermore, reference numeral 42 denotes an active layer, 43 denotes a gate insulator layer, 44 denotes a gate electrode, 45 denotes an interlayer insulator film, 46 denote metallic wiring electrodes, and 47 denote impurity introduced regions so-called source and drain regions. According to this embodiment, as illustrated in FIG. 4, the light 48 to be detected is inputted from the upper face of the phototransistors, and then this light is converted into electrical signals at the active layer 42.

These phototransistors are thin-film phototransistors which can be simultaneously formed with the fabrication processes of Thin-Film Transistors (TFTs).

Referring to FIGS. 5a to 5l which show processes of fabricating the solid-state image pickup elements 31 and their drive circuits 32 in this embodiment, herein after, the fabrication processes will be described in detail.

Figure 5A:
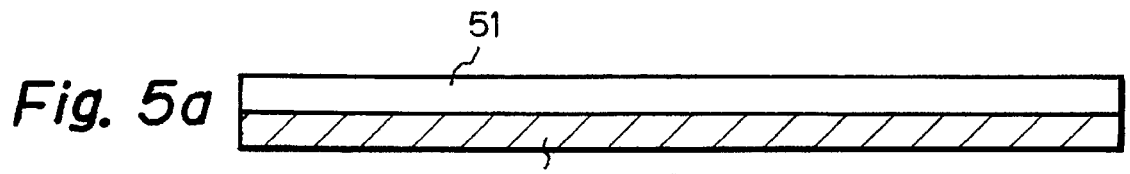

First, a substrate 50 (30, 40) such as for example a low priced and low graded monocrystal silicon substrate or polycrystal silicon substrate is prepared. By heat-treating this substrate 50, a thermal oxide silicon layer with a thickness of 300 nm is grown. If the silicon substrate 50 is low graded one, the thermal oxide silicon layer may contain impurity. Therefore, on this thermal oxide silicon layer, a pure oxide silicon layer with a thickness of 500 nm is deposited in accordance with LPCVD (Low-Pressure Chemical Vapor Deposition) method. As a result, an insulator layer 51 is formed on the silicon substrate 50 as shown in FIG. 5a.

Figure 5B:
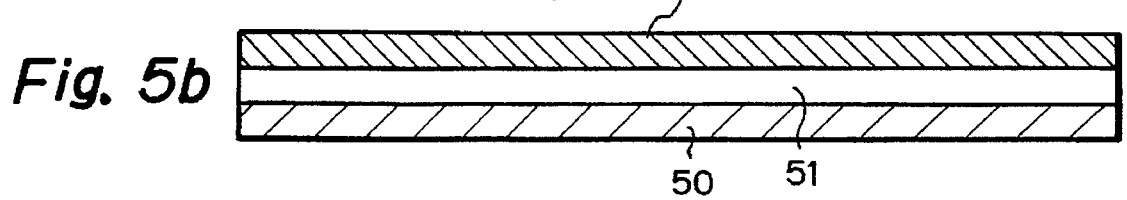

On the insulator layer 51, an amorphous silicon layer with a thickness of 200 nm is deposited as an active layer 52 in accordance with plasma CVD (Chemical Vapor Deposition) method, as shown in FIG. 5b. The deposition is carried out under a condition wherein process gas is silane gas, reaction temperature is 200° C., gas pressure is 5.3 Pa, RF power is 35 W, and deposition speed is 6 nm/min. After the deposition, the substrate is heated at 600° C. for 20 hours so that the amorphous silicon is grown in solid-phase to form a crystalline layer. The LPCVD method can be used instead of the plasma CVD method.

Figure 5C:
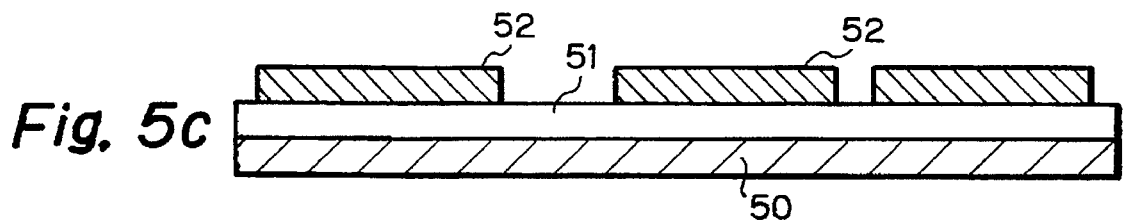

Then, as shown in FIG. 5c, parts of the thus formed polysilicon active layer 52 are eliminated to shape island pattern.

Figure 5D:
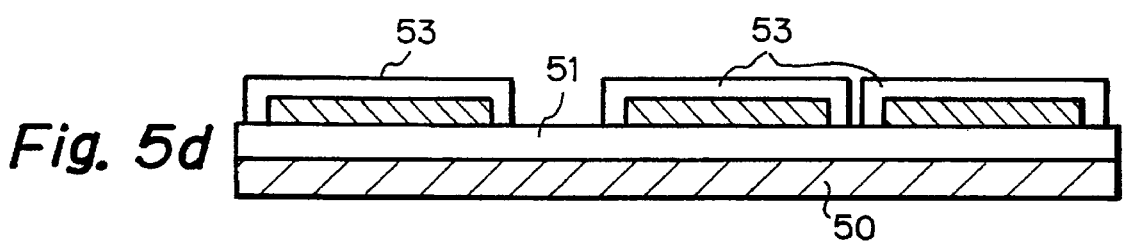

Thereafter, the polysilicon active layer 52 is thermally oxidized so that a gate thermal oxide silicon layer 53 with a thickness of 100 nm for example is formed, as shown in FIG. 5d.

Figure 5E:
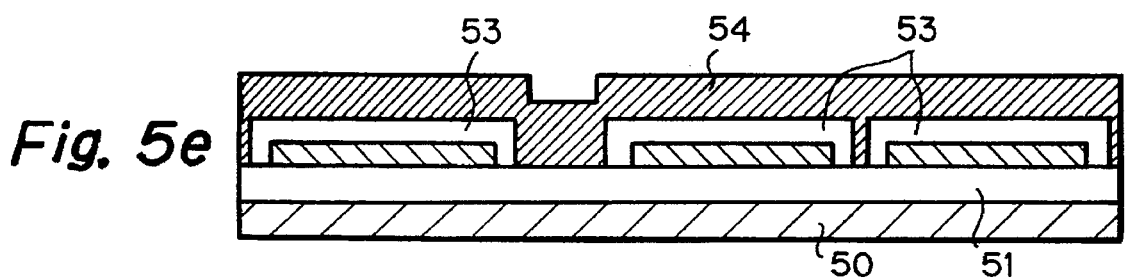

As soon as the oxide silicon layer 53 is formed, an $n^+$ polysilicon (poly-Si) layer with a thickness of about 200 nm into which phosphorus of $1\times10^{20}$ atoms/$cm^2$ or more is doped, is deposited by the LPCVD method, as a gate electrode layer 54 shown in FIG. 5e.

Figure 5F:
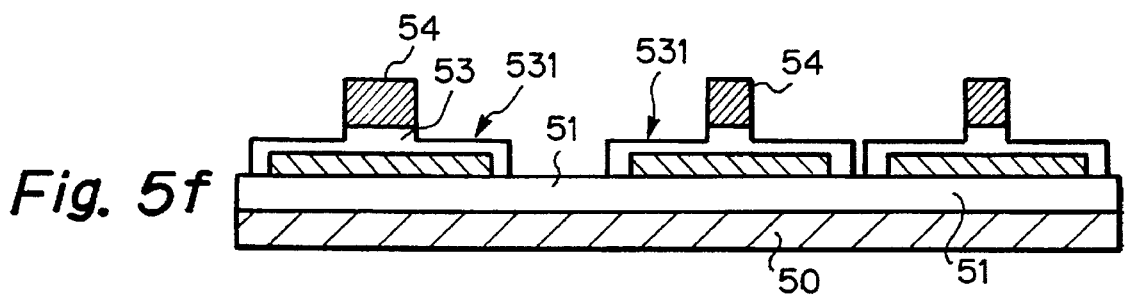

Then, as shown in FIG. 5f, parts of the gate electrode layer 54 and also oxide silicon layer 531 on the active layer 52 at regions of contact layers are eliminated by a dry etching method. The oxide silicon layers 531 within the contact layer regions may be partially removed so that its thickness becomes half, or in some cases, whole the oxide silicon layers 531 within the contact layer regions may be removed.

Then, impurity is introduced into the active layer 52 by an ion implantation method or an ion doping method to form dopant-introduced regions 52N and 52P.

To form the N-type region 52N, phosphorus of $1\times10^{15}$ atoms/$cm^2$ is implanted at an acceleration voltage of 60 kV as shown in FIG. 5g. To form the P-type region 52P, unnecessary portion for ion implantation is masked by a photoresist layer 55, and then boron of dose $5\times10^{15}$ atoms/$cm^2$ is implanted at an acceleration voltage of 40 kV as shown in FIG. 5h. Then, in order to activate these dopant atoms, heat treatment with nitrogen gas at an annealing temperature of 600° C. for 12 hours is carried out.

In next step, an interlayer insulator film such as an oxide silicon layer or a PSG (Phosphor Silicate Glass) layer with a thickness of about 800 nm is deposited by an atmospheric pressure CVD method as shown in FIG. 5i, and then contact holes 57 are formed as shown in FIG. 5j. Thereafter, an aluminum (Al) layer 58 is formed by a spattering method as shown in FIG. 5k, and then the Al layer 58 is etched to form Al wiring patterns 58 as shown in FIG. 5l. Finally, an annealing treatment with hydrogen gas at a temperature of 300° C. for 1 hour is carried out so as to improve its electrical characteristics.

Thus, solid-state image pickup elements and their drive circuits can be simultaneously fabricated on the same substrate 50 (30).

Referring to FIGS. 6a to 6i which show processes of fabricating the thin film EL element 34 in this embodiment, herein after, the fabrication processes will be described in detail.

Figure 6A:
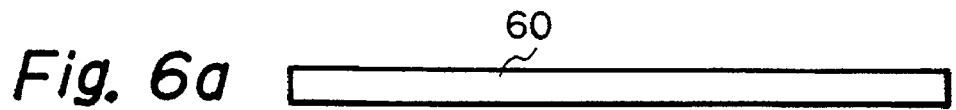
FIGS. 6a to 6i show processes of fabricating a thin film EL element in the embodiment of FIG. 3.

First, a transparent substrate 60 (33) shown in FIG. 6a such as for example a thin glass plate with a thickness of 50 to 200 μm is prepared and is cleaned. If the thickness of the transparent substrate 60 is more than 200 μm, reflected light from the original to be applied to a neighbor solid-state image pickup element may be mixed causing optical resolution to decrease. Contrary to this, if the thickness of the transparent substrate 60 is less than 50 μm, strength to act as a substrate cannot be maintained.

Figure 6B:
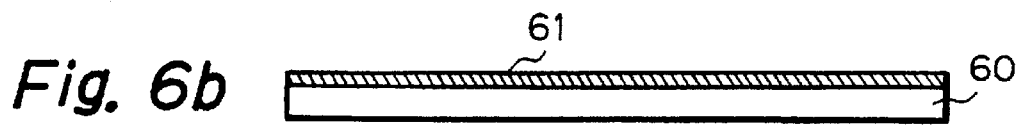
Figure 6C:
Figure 6D:
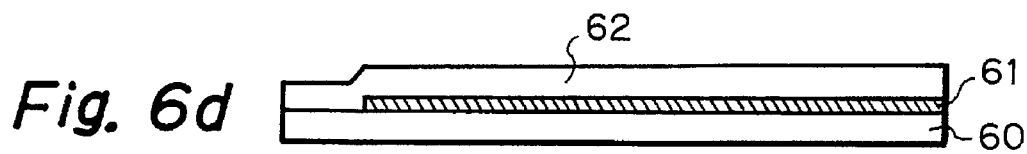

Then, a transparent electrode 61 of an ITO (Indium Tin Oxide) film is formed on the substrate 60 as shown in FIG. 6b. After that, patterning of this ITO film 61 is carried out as shown in FIG. 6c, and then an insulator layer 62 is formed thereon by an SOG (Spin On Glass) film whose main component is for example $SiO_2$ as shown in FIG. 6d. During fabrication of this film, it is desired to hydrogenate the film to improve the characteristics of the ITO film (to reduce its resistance value and to increase its transparency) if necessary.

Figure 6E:
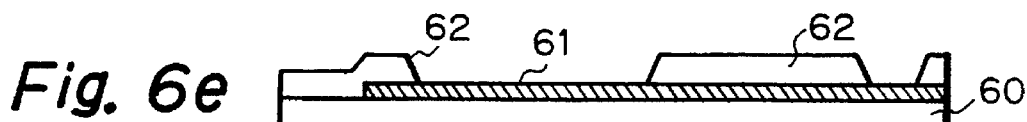
Figure 6F:
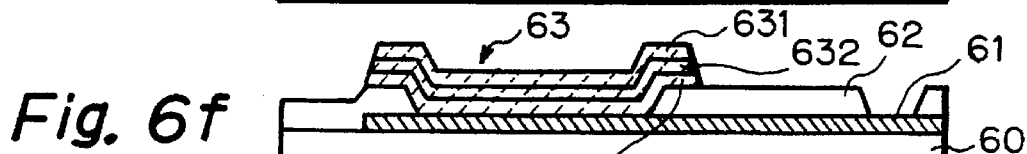

Then, as shown in FIG. 6e, patterning of this insulator layer 62 is carried out. Thereafter, an organic EL film 63 is deposited thereon by heating the source gas using a necessary mask, as shown in FIG. 6f. The organic EL film 63 in this embodiment is constituted by three layers of an electron transportation layer 631, a hole transportation layer 632 and a light emitting layer 633.

The EL film is not limited to this constitution but may be formed in a two layers of an electron transportation layer (light emitting layer) and a hole transportation layer or in a two layers of an electron transportation layer and a hole transportation layer (light emitting layer).

Figure 6G:
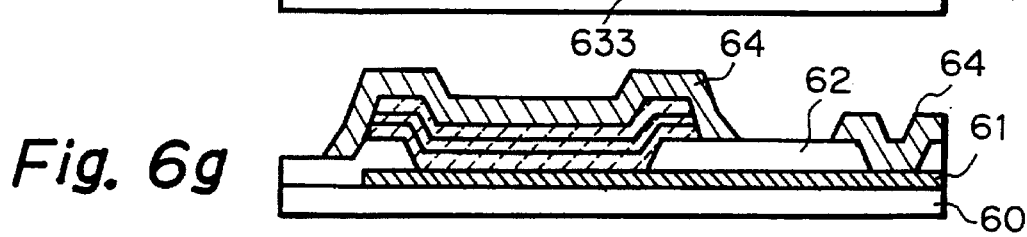
Figure 6H:
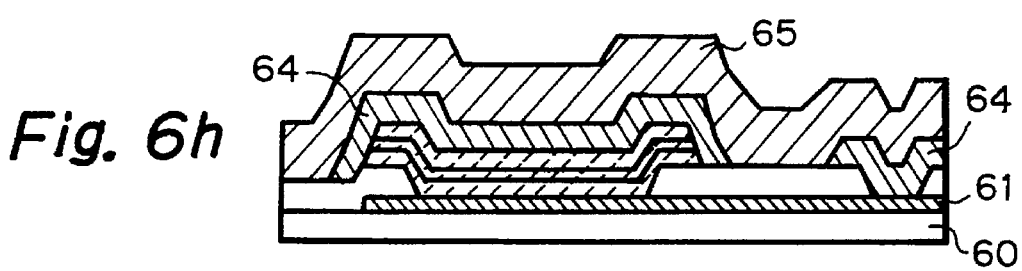
Figure 6I:
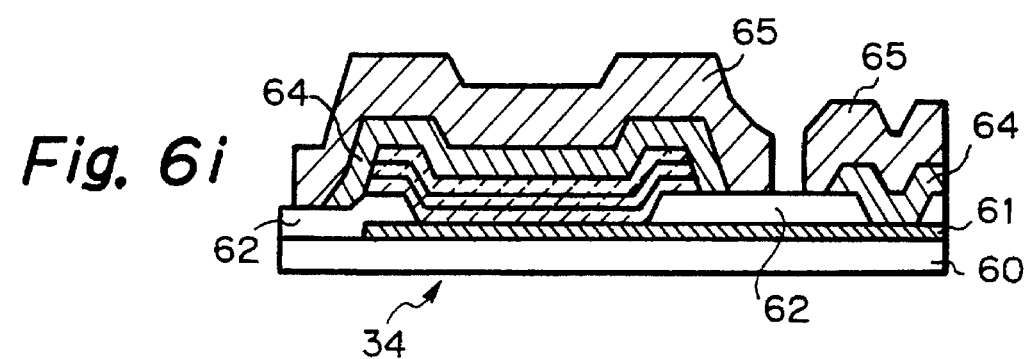

In next step, a MgAg (magnesium-silver alloy) layer 64 is deposited as shown in FIG. 6g, and then an aluminum (Al) layer 65 is formed by sputtering or deposition, as shown in FIG. 6h. Then patterning of this Al layer is performed to make wiring electrodes 65 as shown in FIG. 6i, thus the thin-film EL elements 34 are finally formed.

The transparent substrate 33 on which the thin-film EL element 34 is formed and the substrate 30 on which the solid-state image pickup elements 31 and their drive circuits 32 are formed are, then, fixed to and integrated with each other in parallel by a transparent adhesive 35 so that the surface for the image pickup elements 31 and the surface for the EL element 34 oppose to each other.

According to this embodiment, since the transparent substrate 33 are fixed and integrated with each other in parallel so that the surface for the image pickup elements 31 and the surface for the EL element 34 oppose to each other, a low cost linear array image sensor of full-contact type can be fabricated with a very small dimension. Also, according to this embodiment, since the substrate 30 for the image pickup elements 31 can be formed even by nontransparent material, a lower cost linear array image sensor can be fabricated by using a cheaper material for its substrate.

Furthermore, since the light emission part of the EL element 34 constitutes a surface illuminant, not a point source like as an LED, it is possible to uniformly illuminate the original.

Figure 7:
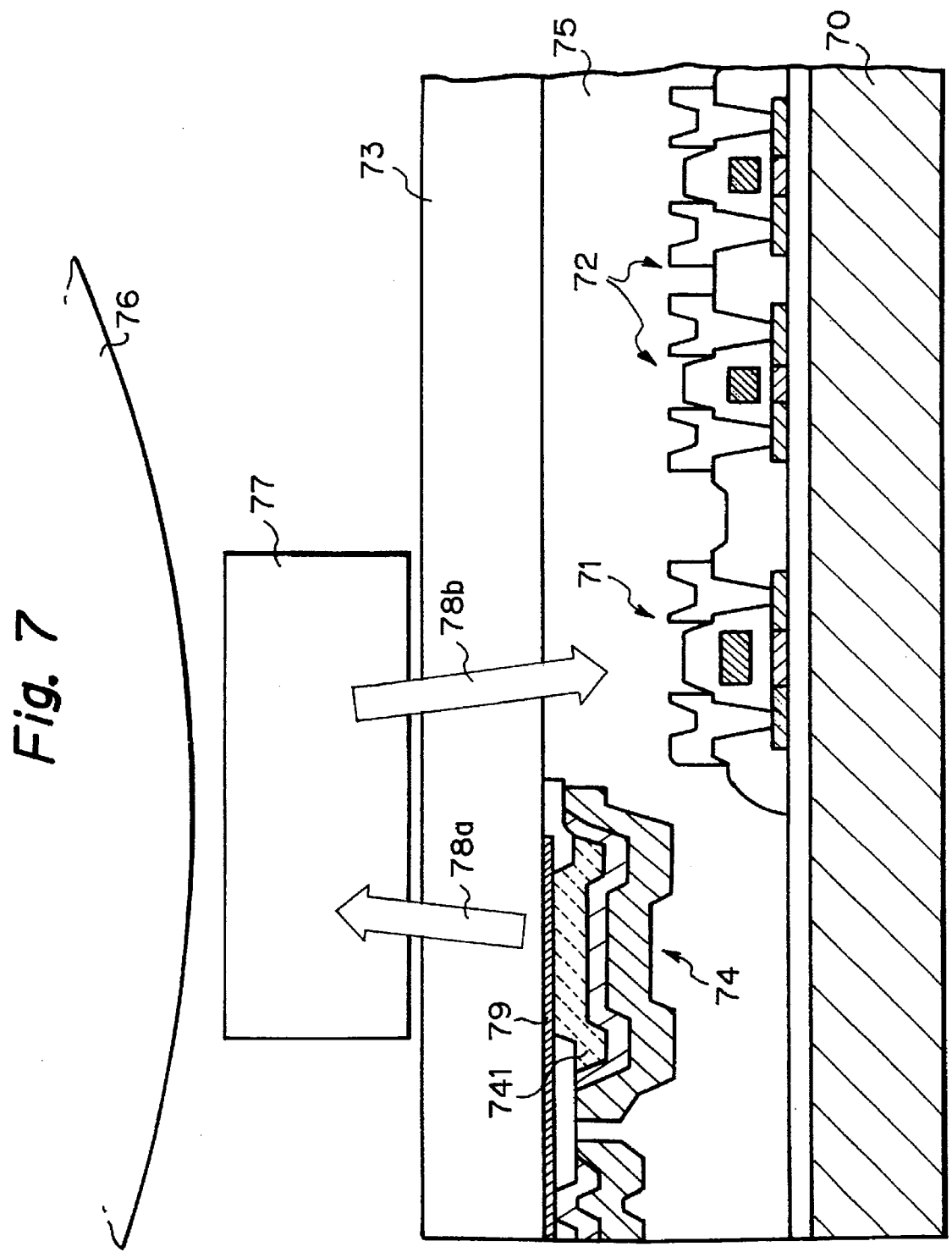
FIG. 7 is a sectional view illustrating a partial constitution of an another embodiment of a linear array image sensor according to the present invention.

FIG. 7 illustrates a partial constitution of an another embodiment of a linear array image sensor according to the present invention. This image sensor is a semi-contact type linear array image sensor.

As shown in the figure, on one surface of a substrate 70, a large number of solid-state image pickup elements (photoelectric conversion elements) 71 and a large number of reading drive circuits 72 for the respective image pickup elements 71 are linearly formed. The substrate 70 is made of for example glass, quartz, ceramics ($Al_2O_3$) or silicon (monocrystal or polycrystal).

On one surface of a transparent substrate 73 constituted by a glass plate, a single thin-film light emission element 74 such as an organic EL (Electro-Luminescent) element is linearly formed along the many image pickup elements 71 on the substrate 70. The thin-film light emission element 74 can be formed by an inorganic EL element. The substrate 70 and the transparent substrate 73 are fixed to and integrated with each other in parallel by a transparent adhesive 75 such as for example an epoxy adhesive or an ultraviolet-curing adhesive so that the surface of the substrate 70 on which the image pickup elements 71 are formed and the surface of the transparent substrate 73 on which the EL element 74 is formed oppose to each other.

In this embodiment, a distributed index lens array 77 so-called a SELFOC lens array is mounted above the other surface of the transparent substrate 73. In operation, an original 76 with images is read out through this SELFOC lens array 77. By using the SELFOC lens array 77, the focal depth will be increased resulting that a normal glass with a thickness of 200μ or more can be utilized as the transparent substrate 73 instead of the thin glass plate in the embodiment of FIG. 3. The original 76 can be read out without in contact with the surface of the SELFOC lens array 77.

Light 78a from a light emission layer 743 of the EL element 74 is applied to the surface of the original 76 via a transparent electrode 79, the transparent substrate 73 and the SELFOC lens array 77, and reflected light 78b from the surface of the original 76 is applied to the image pickup elements 71 via the SELFOC lens array 77, the transparent substrate 73 and the transparent adhesive 75 so as to be converted into electrical signals. The converted electrical signals are then inputted into the reading drive circuits 72 so as to provide image signals with levels corresponding upon the gradation of the original 76.

Structure of each the image pickup elements 71 and the fabrication processes of the image pickup elements 71, their drive circuits 72 and the EL element 74 are the same as these in the embodiment of FIG. 3.

According to this embodiment, in addition to the advantages of the embodiment of FIG. 3, a glass plate with a normal thickness which will be a lower cost can be used as the transparent substrate 73 causing the whole fabrication cost of the image sensor to reduce.

Figure 8:
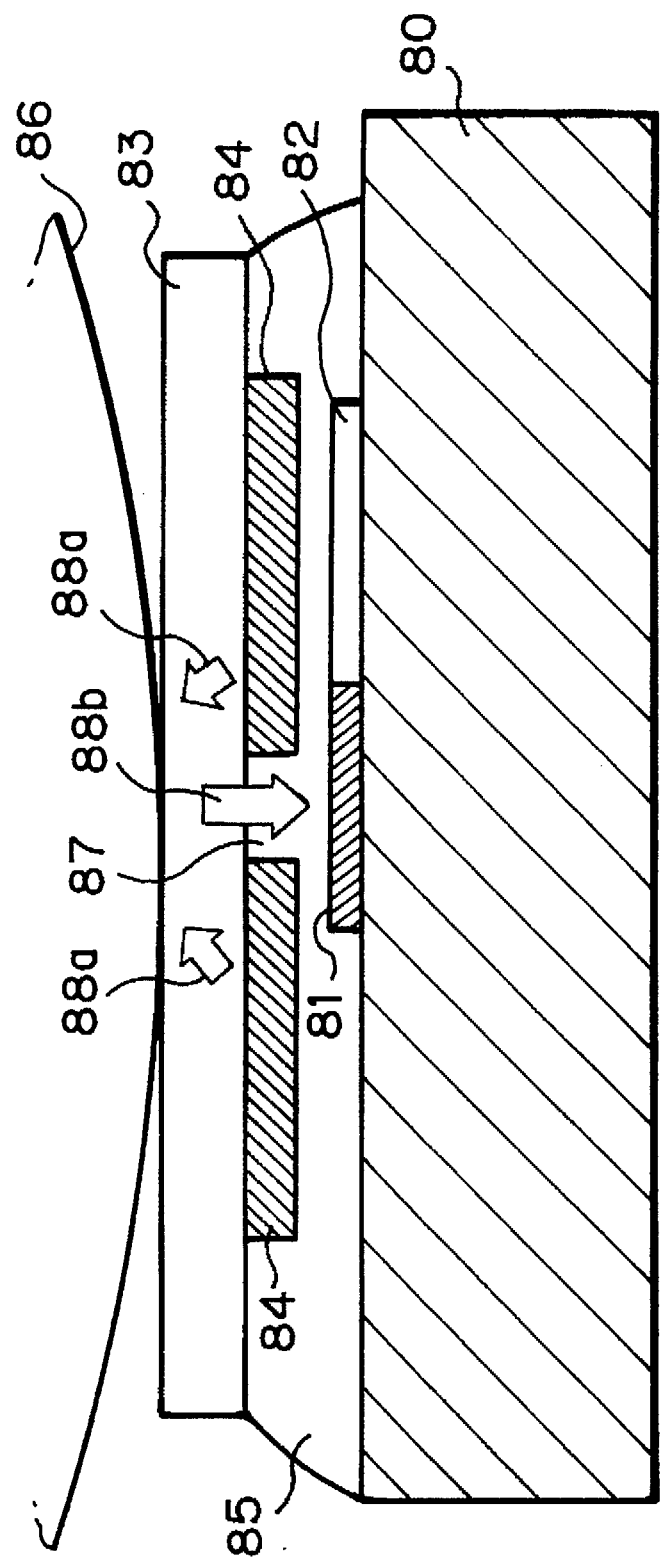
FIG. 8 is a sectional view illustrating a partial constitution of a further embodiment of a linear array image sensor according to the present invention.

FIG. 8 illustrates a partial constitution of a further embodiment of a linear array image sensor according to the present invention. This image sensor is a full-contact type linear array image sensor.

As shown in the figure, on one surface of a substrate 80, a large number of solid-state image pickup elements (photoelectric conversion elements) 81 and a large number of reading drive circuits 82 for the respective image pickup elements 81 are linearly formed. The substrate 80 is made of for example glass, quartz, ceramics ($Al_2O_3$) or silicon (monocrystal or polycrystal).

On one surface of a transparent substrate 83 constituted by a thin glass plate, two parallel thin-film light emission elements 84 such as organic EL (Electro-Luminescent) elements are linearly formed along the many image pickup elements 81 on the substrate 80. The thin-film light emission elements 84 can be formed by inorganic EL elements. Between the light emission elements 84, an elongated window 87 is linearly formed along them. The substrate 80 and the transparent substrate 83 are fixed to and integrated with each other in parallel by a transparent adhesive 85 such as for example an epoxy adhesive or an ultraviolet-curing adhesive so that the surface of the substrate 80 on which the image pickup elements 81 are formed and the surface of the transparent substrate 83 on which the EL elements 84 are formed oppose to each other and that the window 87 locates just above the image pickup elements 81.

In operation, an original 86 with images to be read out is kept in contact with the other surface of the transparent substrate 83. Light 88a from a light emission layer of the EL elements 84 is applied to the surface of the original 86 via the transparent substrate 83, and reflected light 88b from the surface of the original 86 is applied to the image pickup elements 81 via the transparent substrate 83, the elongated window 87 and the transparent adhesive 85 so as to be converted into electrical signals. The converted electrical signals are then inputted into the reading drive circuits 82 so as to provide image signals with levels corresponding upon the gradation of the original 86.

Structure of each the image pickup elements 81 and the fabrication processes of the image pickup elements 81 and their drive circuits 82 are the same as these in the embodiment of FIG. 3.

Referring to FIGS. 9a to 9i which show processes of fabricating the thin film EL elements 84 in this embodiment, herein after, the fabrication processes will be described in detail.

Figure 9A:
FIGS. 9a to 9i show processes of fabricating thin film EL elements in the embodiment of FIG. 8.

First, a transparent substrate 90 (83) shown in FIG. 9a such as for example a thin glass plate with a thickness of 50 to 200 µm is prepared and is cleaned. If the thickness of the transparent substrate 90 is more than 200 µm, reflected light from the original to be applied to a neighbor solid-state image pickup element may be mixed causing optical resolution to decrease. Contrary to this, if the thickness of the transparent substrate 90 is less than 50 µm, strength to act as a substrate cannot be maintained.

Figure 9B:
Figure 9C:
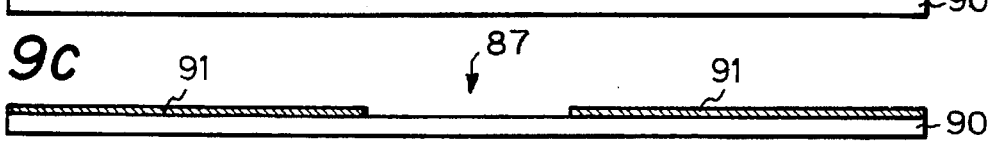
Figure 9D:
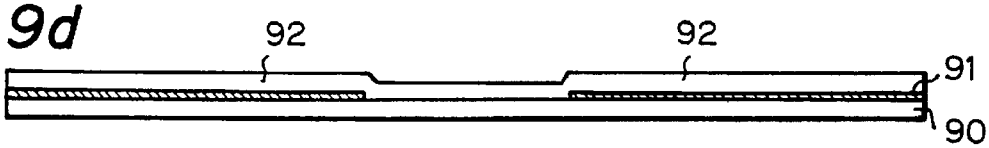

Then, a transparent electrode 91 of an ITO (Indium Tin Oxide) film is formed on the substrate 90 as shown in FIG. 9b. After that, patterning of this ITO film 91 is carried out so as to form an elongated window 87 as shown in FIG. 9c, and then an insulator layer 92 is formed thereon by an SOG (Spin On Glass) film whose main component is for example $SiO_2$ as shown in FIG. 9d. During fabrication of this film, it is desired to hydrogenate the film to improve the characteristics of the ITO film (to reduce its resistance value and to increase its transparency) if necessary.

Figure 9E:
Figure 9F:
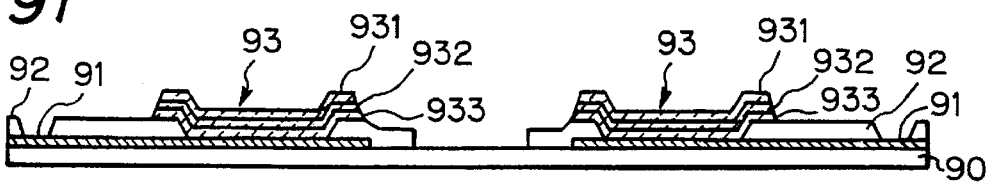

Then, as shown in FIG. 9e, patterning of this insulator layer 92 is carried out. Thereafter, an organic EL film 93 is deposited thereon by heating the source gas using a necessary mask, as shown in FIG. 9f. The organic EL film 93 in this embodiment is constituted by three layers of an electron transportation layer 931, a hole transportation layer 932 and a light emitting layer 933.

The EL film is not limited to this constitution but may be formed in a two layers of an electron transportation layer (light emitting layer) and a hole transportation layer or in a two layers of an electron transportation layer and a hole transportation layer (light emitting layer).

Figure 9G:
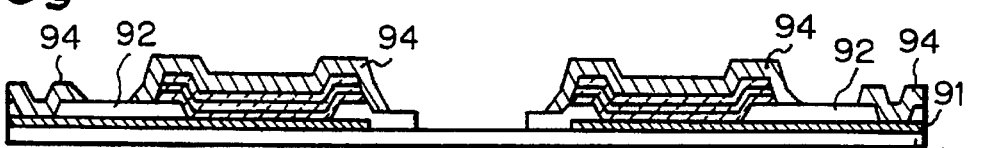
Figure 9H:
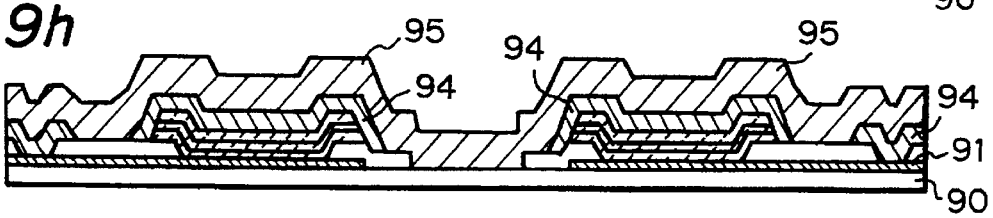
Figure 9I:
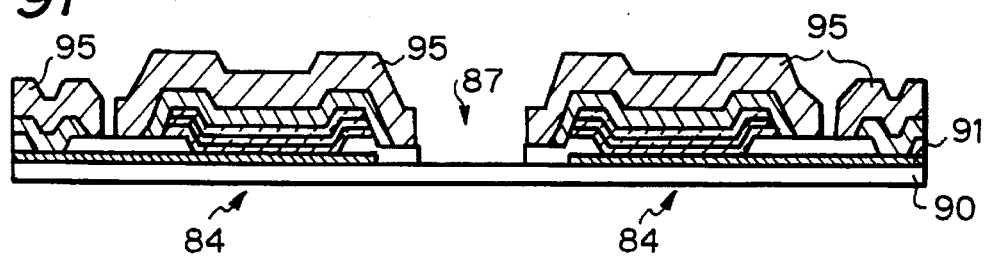

In next step, a MgAg (magnesium-silver alloy) layer 94 is deposited as shown in FIG. 9g, and then an aluminum (Al) layer 95 is formed by sputtering or deposition, as shown in FIG. 9h. Then patterning of this Al layer is performed to make wiring electrodes 95 as shown in FIG. 9i, thus the thin-film EL elements 84 are finally formed.

The transparent substrate 83 on which the thin-film EL element 84 is formed and the substrate 80 on which the solid-state image pickup elements 81 and their drive circuits 82 are formed are, then, fixed to and integrated with each other in parallel by a transparent adhesive 85 so that the surface for the image pickup elements 81 and the surface for the EL elements 84 oppose to each other.

According to this embodiment, since the transparent substrate 83 are fixed and integrated with each other in parallel so that the surface for the image pickup elements 81 and the surface for the EL elements 84 oppose to each other, a low cost linear array image sensor of full-contact type can be fabricated with a very small dimension. Also, according to this embodiment, since the substrate 80 for the image pickup elements 81 can be formed even by nontransparent material, a lower cost linear array image sensor can be fabricated by using a cheaper material for its substrate. Furthermore, since the light emission part of the EL elements 84 constitutes a surface illuminant, not a point source like as an LED, it is possible to uniformly illuminate the original.

In addition to the above-mentioned advantages, according to this embodiment, since the MgAg layer 94 and also the aluminum layer 95 shade the light from the EL elements 84 and the reflected light, no additional light-shield layer is necessary for protecting the circuits on the substrate 80 from light incidence and for preventing stray light from being applied to the image pickup elements 81.

Figure 10:
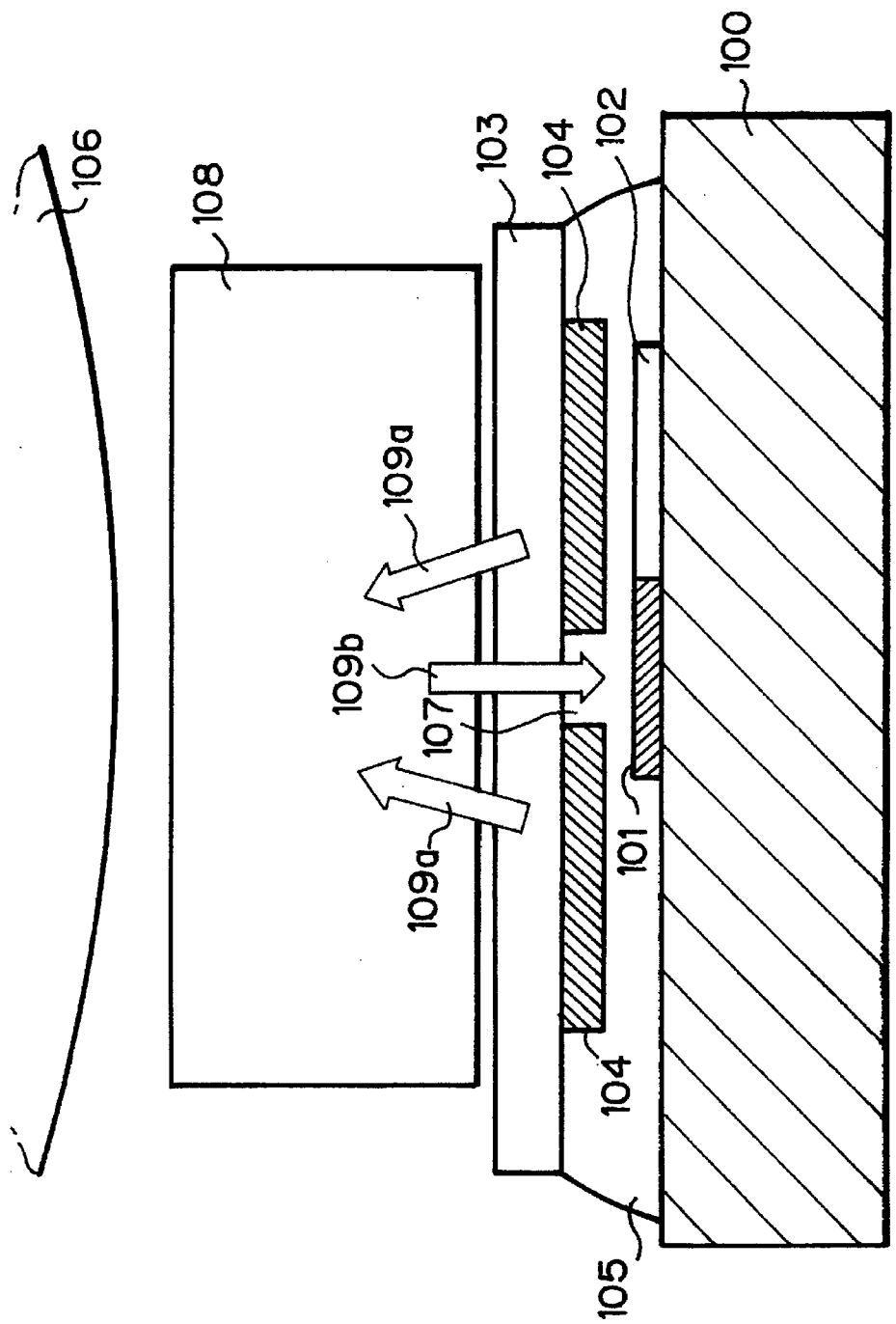
FIG. 10 is a sectional view illustrating a partial constitution of a still further embodiment of a linear array image sensor according to the present invention.

FIG. 10 illustrates a partial constitution of a still another embodiment of a linear array image sensor according to the present invention. This image sensor is a semi-contact type linear array image sensor.

As shown in the figure, on one surface of a substrate 100, a large number of solid-state image pickup elements (photoelectric conversion elements) 101 and a large number of reading drive circuits 102 for the respective image pickup elements 101 are linearly formed. The substrate 100 is made of for example glass, quartz, ceramics ($Al_2O_3$) or silicon (monocrystal or polycrystal).

On one surface of a transparent substrate 103 constituted by a glass plate, two parallel thin-film light emission elements 104 such as organic EL (Electro-Luminescent) elements are linearly formed along the many image pickup elements 101 on the substrate 100. The thin-film light emission elements 104 can be formed by inorganic EL elements. Between the light emission elements 104, an elongated window 107 is linearly formed along them. The substrate 100 and the transparent substrate 103 are fixed to and integrated with each other in parallel by a transparent adhesive 105 such as for example an epoxy adhesive or an ultraviolet-curing adhesive so that the surface of the substrate 100 on which the image pickup elements 101 are formed and the surface of the transparent substrate 103 on which the EL elements 104 are formed oppose to each other and that the window 107 locates just above the image pickup elements 101.

In this embodiment, a distributed index lens array 108 so-called a SELFOC lens array is mounted above the other surface of the transparent substrate 103. In operation, an original 106 with images is read out through this SELFOC lens array 108. By using the SELFOC lens array 108, the focal depth will be increased resulting that a normal glass with a thickness of 200µ or more can be utilized as the transparent substrate 103 instead of the thin glass plate in the embodiment of FIG. 8. The original 106 can be read out without in contact with the surface of the SELFOC lens array 108.

Light 109a from a light emission layer of the EL elements 104 is applied to the surface of the original 106 via the transparent substrate 103 and the SELFOC lens array 108, and reflected light 109b from the surface of the original 106 is applied to the image pickup elements 101 via the SELFOC lens array 108, the transparent substrate 103, the window 107 and the transparent adhesive 105 so as to be converted into electrical signals. The converted electrical signals are then inputted into the reading drive circuits 102 so as to provide image signals with levels corresponding upon the gradation of the original 106.

Structure of each the image pickup elements 101 and the fabrication processes of the image pickup elements 101, their drive circuits 102 and the EL elements 104 are the same as these in the embodiment of FIG. 8.

According to this embodiment, in addition to the advantages of the embodiment of FIG. 8, a glass plate with a normal thickness which will be a lower cost can be used as the transparent substrate 103 causing the whole fabrication cost of the image sensor to reduce.

Figure 11:
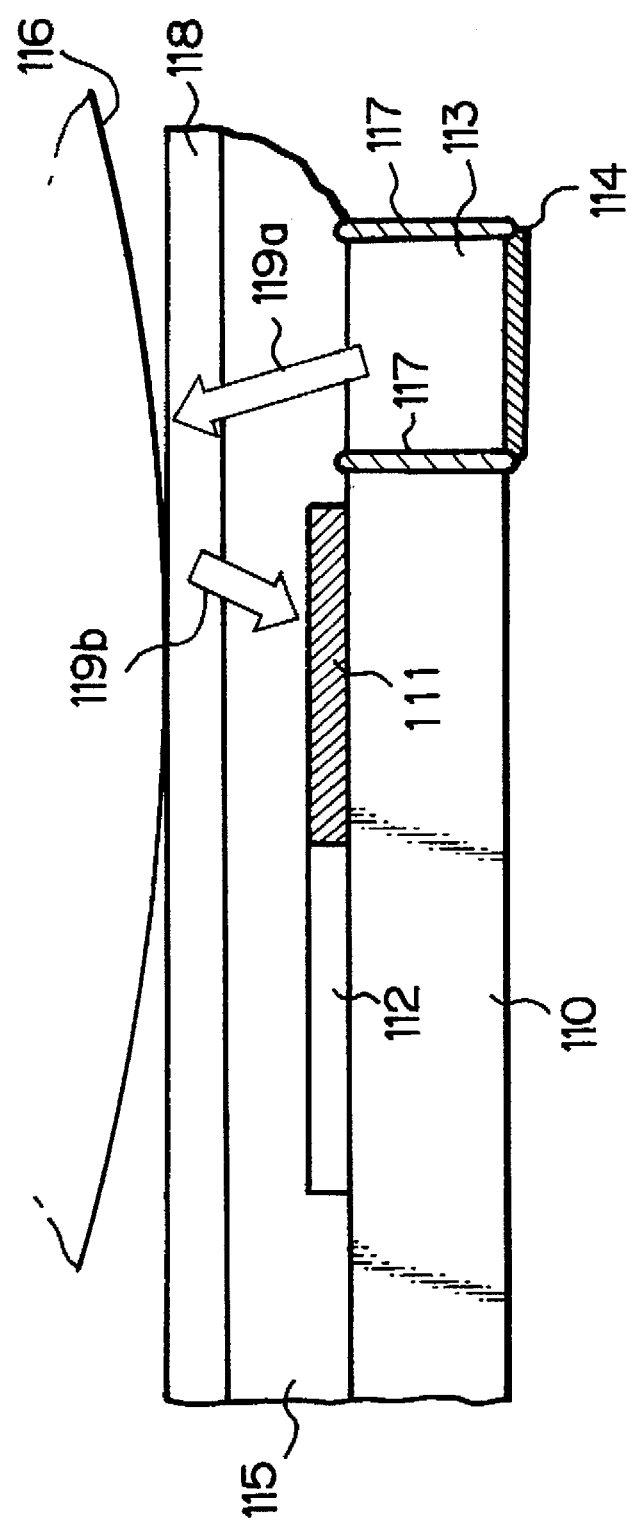
FIG. 11 is a sectional view illustrating a partial constitution of a further embodiment of a linear array image sensor according to the present invention.

FIG. 11 illustrates a partial constitution of a further embodiment of a linear array image sensor according to the present invention. This image sensor is a full-contact type linear array image sensor.

As shown in the figure, on one surface of a substrate 110, a large number of solid-state image pickup elements (photoelectric conversion elements) 111 and a large number of reading drive circuits 112 for the respective image pickup elements 111 are linearly formed. The substrate 110 is made of for example glass, quartz, ceramics ($Al_2O_3$) or silicon (monocrystal or polycrystal).

The substrate 110 and a transparent substrate 113 having substantially the same thickness as the substrate 110 stand side by side so that a side surface of the transparent substrate 113 is abutted to a side surface of the substrate 110. The substrates 110 and 113 are fixed to each other in parallel by a housing (not shown) or for example an iron plate (not shown). On the bottom surface of the transparent substrate 113, a single thin-film light emission element 114 such as an organic EL (Electro-Luminescent) element is linearly formed along the many image pickup elements 111 on the substrate 110. The thin-film light emission element 114 can be formed by an inorganic EL element. A reflector layer 117 of a thin film, a thick film or a metallic foil such as an Al film for reflecting light is formed to cover the side surfaces of the transparent substrate 113.

Above the surface of the substrate 110 on which the image pickup elements 111 are formed and the surface of the transparent substrate 113 on opposite surface of which the EL element 114 is formed, a transparent thin plate 118 constituted by a thin glass plate with a thickness of 50 to 200 μm is attached. The substrate 110, the transparent substrate 113 and the transparent thin plate 118 are fixed to and integrated with each other in parallel by a transparent adhesive 115 such as for example an epoxy adhesive or an ultraviolet-curing adhesive.

In operation, an original 116 with images to be read out is kept in contact with the other surface of the transparent thin plate 118. Light 119a from a light emission layer of the EL element 114 is applied to the surface of the original 116 via the transparent substrate 113, the transparent adhesive 115 and the transparent thin plate 118, and reflected light 119b from the surface of the original 116 is applied to the image pickup elements 111 via the transparent thin plate 118 and the transparent adhesive 115 so as to be converted into electrical signals. The converted electrical signals are then inputted into the reading drive circuits 112 so as to provide image signals with levels corresponding upon the gradation of the original 116.

Structure of each the image pickup elements 111 and the fabrication processes of the image pickup elements 111, their drive circuits 112 and the EL element 114 are the same as these in the embodiment of FIG. 3.

Referring to FIGS. 12a to 12i which show processes of fabricating the thin film EL element 114 in this embodiment, herein after, the fabrication processes will be described in detail.

Figure 12A:
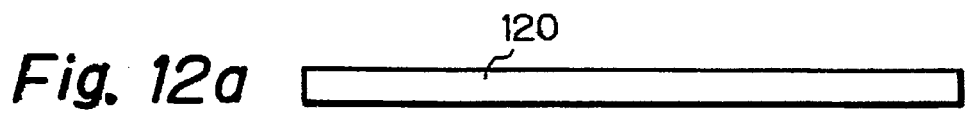
FIGS. 12a to 12i show processes of fabricating a thin film EL element in the embodiment of FIG. 11.

First, a transparent substrate 120 (113) shown in FIG. 12a such as for example a glass plate with substantially the same thickness as the substrate 110 is prepared and is cleaned.

Figure 12B:
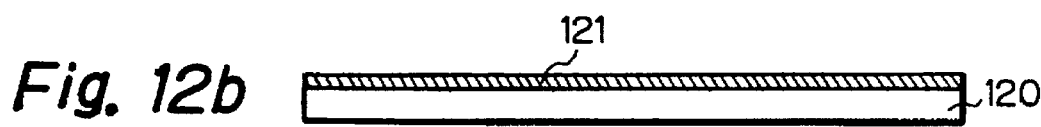
Figure 12C:
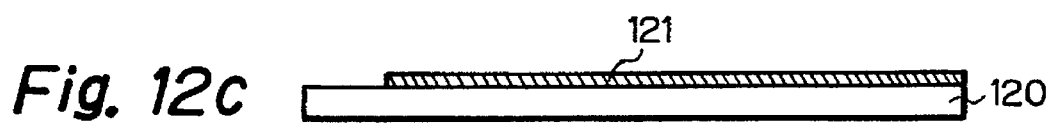
Figure 12D:
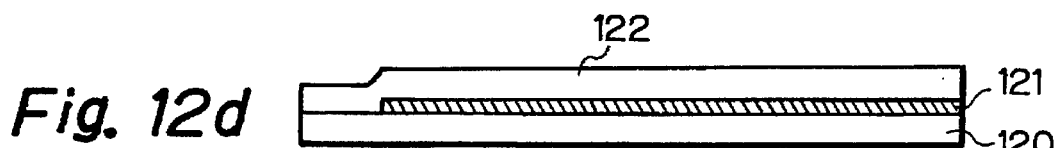

Then, a transparent electrode 121 of an ITO (Indium Tin Oxide) film is formed on the substrate 120 as shown in FIG. 12b. After that, patterning of this ITO film 121 is carried out as shown in FIG. 12c, and then an insulator layer 122 is formed thereon by an SOG (Spin On Glass) film whose main component is for example $SiO_2$ as shown in FIG. 12d. During fabrication of this film, it is desired to hydrogenate the film to improve the characteristics of the ITO film (to reduce its resistance value and to increase its transparency) if necessary.

Figure 12E:
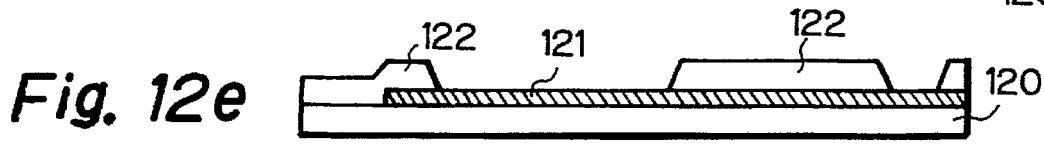
Figure 12F:
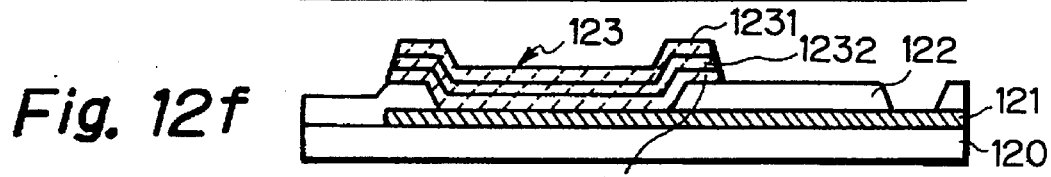

Then, as shown in FIG. 12e, patterning of this insulator layer 122 is carried out. Thereafter, an organic EL film 123 is deposited thereon by heating the source gas using a necessary mask, as shown in FIG. 12f. The organic EL film 123 in this embodiment is constituted by three layers of an electron transportation layer 1231, a hole transportation layer 1232 and a light emitting layer 1233.

The EL film is not limited to this constitution but may be formed in a two layers of an electron transportation layer (light emitting layer) and a hole transportation layer or in a two layers of an electron transportation layer and a hole transportation layer (light emitting layer).

Figure 12G:
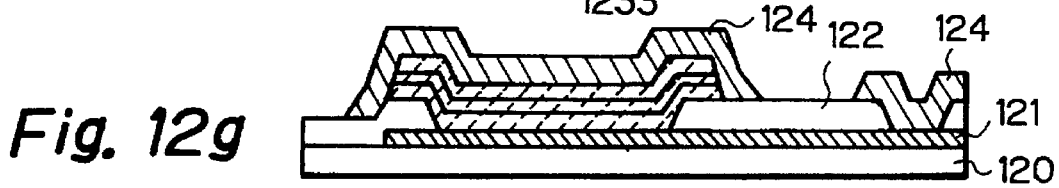
Figure 12H:
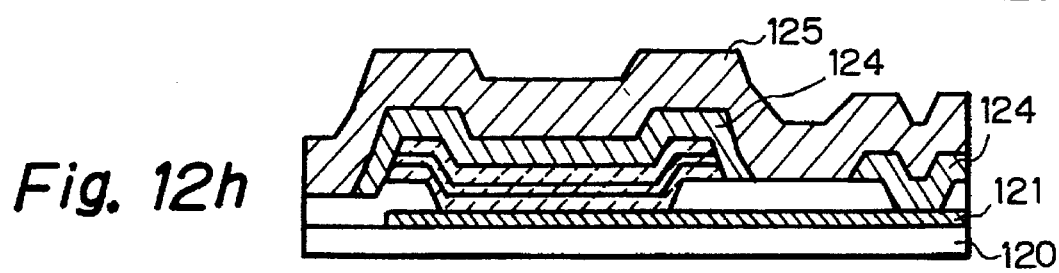
Figure 12I:
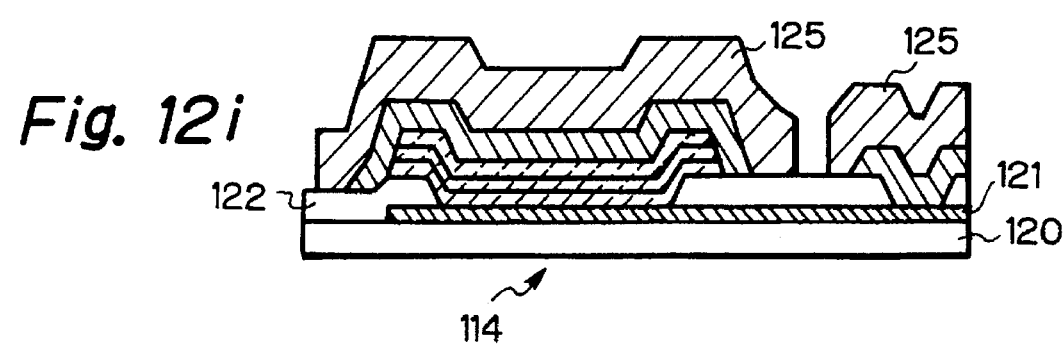

In next step, a MgAg (magnesium-silver alloy) layer 124 is deposited as shown in FIG. 12g, and then an aluminum (Al) layer 125 is formed by sputtering or deposition, as shown in FIG. 12h. Then patterning of this Al layer is performed to make wiring electrodes 125 as shown in FIG. 12i, thus the thin-film EL elements 124 are finally formed.

Then, as shown in FIG. 11, the side surfaces (or one of the side surfaces) of the transparent substrate 113 are covered by the reflector layer(s) 117 of a thin film, a thick film or a metallic foil such as an Al film for reflecting light. Thereafter, this transparent substrate 113 and the substrate 110 are fixed to a housing (not shown) or for example an iron plate (not shown) so that the substrates 110 and 113 stand side by side and that the side surface of the transparent substrate 113 is abutted and fixed to the side surface of the substrate 110. The substrates 110 and 113 can be fixed to each other with a space between them.

As for the transparent thin plate 118, a thin glass plate with a thickness of 50 to 200μ may be used. If the thickness of the thin plate 118 is more than 200 μm, reflected light from the original to be applied to a neighbor solid-state image pickup element may be mixed causing optical resolution to decrease. Contrary to this, if the thickness of the thin plate 118 is less than 50 μm, necessary strength cannot be maintained.

According to this embodiment, since the side surfaces of the transparent substrate 113 on the bottom surface of which the EL element 114 is formed are covered by the reflector film 117, it is possible to effectively illuminate the original film 116. In addition, since the light emission part of the EL elements 114 constitutes a surface illuminant, not a point source like as an LED, it is also possible to uniformly illuminate the original 116 without using a diffuser or a diffusing lens.

Furthermore, according to this embodiment, since the transparent substrate 113 on which the EL element 114 is disposed and the substrate 110 on which the image pickup elements 111 are disposed are fixed to and integrated with each other, a low cost linear array image sensor of full-contact type can be fabricated with a very small dimension. Particularly, since the EL element 114 can be formed on the substrate 113 in flat, the transparent substrate 113 and the substrate 110 can be integrated with each other in flat by means of for example a plate causing dimension of the image sensor to extremely decrease.

Also, according to this embodiment, since the substrate 110 for the image pickup elements 111 can be formed even by nontransparent material, a lower cost linear array image sensor can be fabricated by using a cheaper material for its substrate. Contrary to this, by using the same transparent material for both of the substrates 110 and 113, the fabrication cost may be decreased.

Figure 13:
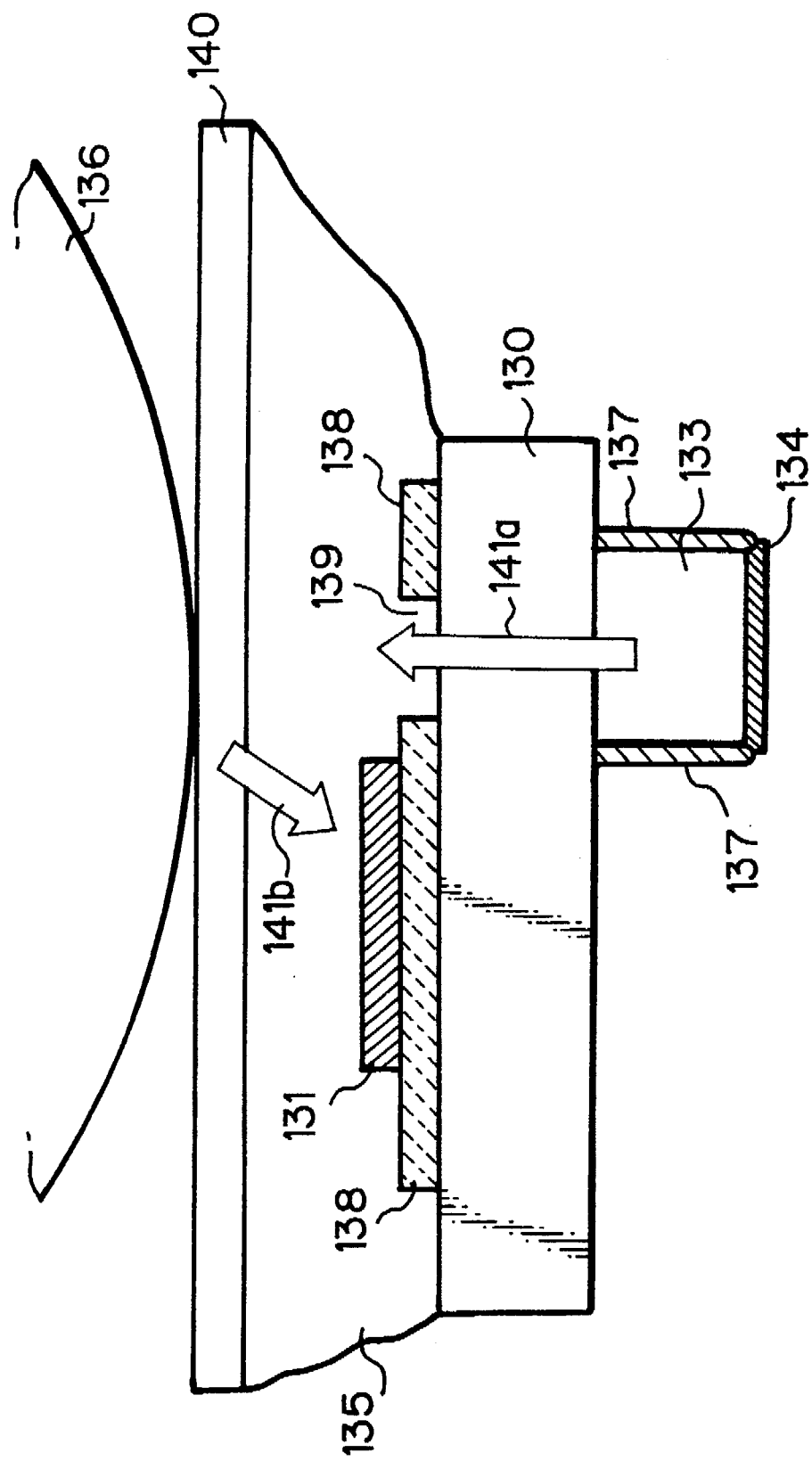
FIG. 13 is a sectional view illustrating a partial constitution of a still further embodiment of a linear array image sensor according to the present invention.

FIG. 13 illustrates a partial constitution of a still further embodiment of a linear array image sensor according to the present invention. This image sensor is also a full-contact type linear array image sensor.

As shown in the figure, on one surface of a transparent substrate 130 made of for example a glass plate, a light-shield layer 138 with a slit like window 139 is formed. On the light-shield layer 138, a large number of solid-state image pickup elements (photoelectric conversion elements) 131 and a large number of reading drive circuits (not shown) for the respective image pickup elements 131 are linearly formed along the window 139.

On the other surface of the transparent surface 130 and at a position just under the window 139, an upper surface of a transparent substrate 133 is fixed by for example a housing (not shown). On the bottom surface of the transparent substrate 133, a single thin-film light emission element 134 such as an organic EL (Electro-Luminescent) element is linearly formed along the many image pickup elements 131 on the substrate 130. The thin-film light emission element 134 can be formed by an inorganic EL element. A reflector layer 137 of a thin film, a thick film or a metallic foil such as an Al film for reflecting light is formed to cover the side surfaces of the transparent substrate 133.

Above the surface of the substrate 130 on which the shield layer 138, the window 139 and the image pickup elements 131 are formed, a transparent thin plate 140 constituted by a thin glass plate with a thickness of 50 to 200 μm is attached. The transparent substrate 130 and the transparent thin plate 140 are fixed and integrated with each other in parallel by a transparent adhesive 135 such as for example an epoxy adhesive or an ultraviolet-curing adhesive.

In operation, an original 136 with images to be read out is kept in contact with the other surface of the transparent thin plate 140. Light 141a from a light emission layer of the EL element 134 is applied to the surface of the original 136 via the transparent substrate 133, the transparent substrate 130, the window 139, the transparent adhesive 135 and the transparent thin plate 140. Reflected light 141b from the surface of the original 136 is applied to the image pickup elements 131 via the transparent thin plate 140 and the transparent adhesive 135 so as to be converted into electrical signals. The converted electrical signals are then inputted into the reading drive circuits so as to provide image signals with levels corresponding upon the gradation of the original 136.

Structure of each the image pickup elements 131 and the fabrication processes of the image pickup elements 131, their drive circuits and the EL element 134 are the same as these in the embodiment of FIG. 11.

In the embodiment of FIG. 13, it is not necessary to use the same material for both the transparent substrates 130 and 133. However, if the same material is used for them, the fabrication cost may be decreased.

Figure 1:
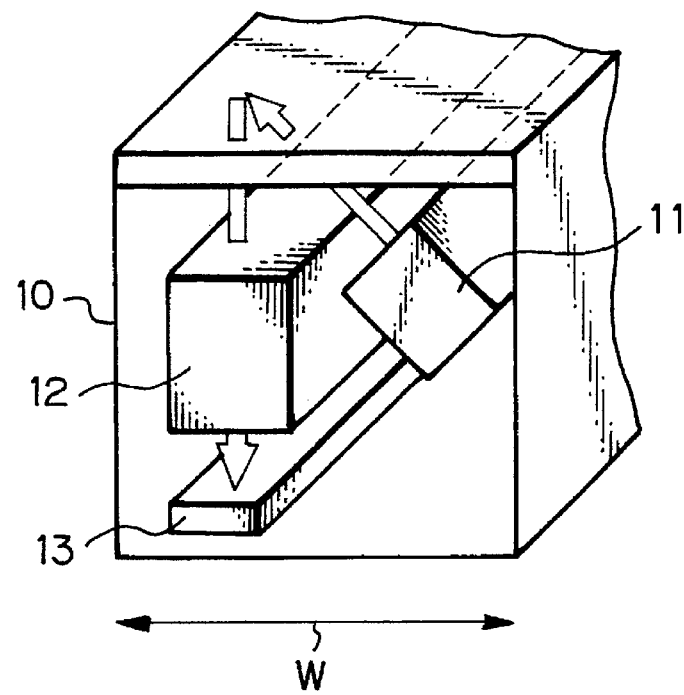
FIG. 1 is an oblique view showing a part of the conventional semi-contact type image sensor already described.
Figure 2:
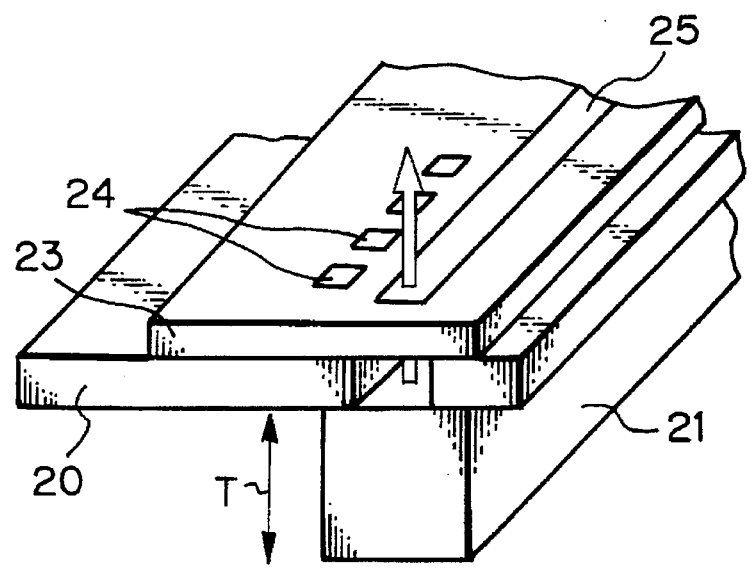
FIG. 2 is an oblique view showing a part of the conventional full-contact type image sensor already described.

Although the total thickness of the image sensor of FIG. 13 will be about double as that of the image sensor of FIG. 11, it can be designed thicker than that of the conventional LED house 11 shown in FIG. 1 by using thin transparent substrates with a thickness of 0.7 to 1.1 mm as for the respective substrates 130 and 133 (total thickness will be 1.4 to 2.2 mm).

As will be apparent from the above-description, according to this embodiment, since the side surfaces of the transparent substrate 133 on the bottom surface of which the EL element 134 is formed are covered by the reflector film 137, it is possible to effectively illuminate the original 136. In addition, since the light emission part of the EL elements 134 constitutes a surface illuminant, not a point source like as an LED, it is also possible to uniformly illuminate the original 136 without using a diffuser or a diffusing lens.

Furthermore, according to this embodiment, since the original 136 is illuminated by a slit light passing through the slit like window 139 in the light-shield layer 138, optical resolution of the image sensor can be extremely improved.

Many widely different embodiments of the present invention may be constructed without departing from the spirit and scope of the present invention. It should be understood that the present invention is not limited to the specific embodiments described in the specification, except as defined in the appended claims.

What is claimed is:

1. A linear array image sensor with a light source, comprising:

a first substrate made of a transparent plate, said first substrate having a first surface and a second surface;

at least one thin-film light emission element disposed on said first surface of the first substrate and linearly elongated in a direction;

a second substrate having two surfaces; and a plurality of solid-state image pickup elements disposed on one of said two surfaces of the second substrate and linearly aligned along said elongated direction of the thin-film light emission element, said first and second substrates being fixed to and integrated with each other by a transparent material so that light originated by said thin-film light emission element is emitted from said second surface of said first substrate and reflected by an image carrier to be detected, and that the reflected light is applied to the plurality of the solid-state image pickup elements through the first substrate.

2. The linear array image sensor as claimed in claim 1, wherein said first and second substrates are integrated by said transparent material so that said first surface of the first substrate and said one surface of the second substrate are in parallel and opposed to with each other.

3. The linear array image sensor as claimed in claim 2, wherein said transparent material is a transparent adhesive inserted between said first and second substrates.

4. The linear array image sensor as claimed in claim 2, wherein said first substrate has a thickness of 50 to 200 μm, and wherein in operation a surface of the image carrier is kept in contact with said second surface of the first substrate.

5. The linear array image sensor as claimed in claim 1, wherein said sensor further comprises a distributed index lens array arranged outside said second surface of the first substrate along said elongated direction of the thin-film light emission element so that light originated by said thin-film light emission element is emitted from said second surface of said first substrate, passed through said distributed index lens array and reflected by an image carrier to be detected, and that the reflected light is applied to the plurality of the solid-state image pickup elements through the distributed index lens array and the first substrate.

6. The linear array image sensor as claimed in claim 1, wherein said thin-film light emission element is constituted by an organic EL element.

7. A linear array image sensor with a light source, comprising:

a first substrate made of a transparent plate, said first substrate having a first surface and a second surface;

two thin-film light emission elements disposed on said first surface of the first substrate and linearly elongated in parallel in a direction to form a slit-shaped window between them;

a second substrate having two surfaces; and a plurality of solid-state image pickup elements disposed on one of said two surfaces of the second substrate and linearly aligned along said elongated direction of the thin-film light emission elements, said first and second substrates being fixed to and integrated with each other by a transparent material so that light originated by said thin-film light emission elements is emitted from said second surface of said first substrate and reflected by an image carrier to be detected, and that the reflected light is applied to the plurality of the solid-state image pickup elements through the first substrate and the slit-shaped window.

8. The linear array image sensor as claimed in claim 7, wherein said first and second substrates are integrated by said transparent material so that said first surface of the first substrate and said one surface of the second substrate are in parallel and opposed to with each other.

9. The linear array image sensor as claimed in claim 8, wherein said transparent material is a transparent adhesive inserted between said first and second substrates.

10. The linear array image sensor as claimed in claim 8, wherein said first substrate has a thickness of 50 to 200 μm, and wherein in operation a surface of the image carrier is kept in contact with said second surface of the first substrate.

11. The linear array image sensor as claimed in claim 7, wherein said sensor further comprises a distributed index lens array arranged outside said second surface of the first substrate along said elongated direction of the thin-film light emission elements so that light originated by said thin-film light emission elements is emitted from said second surface of said first substrate, passed through said distributed index lens array and reflected by an image carrier to be detected, and that the reflected light is applied to the plurality of the solid-state image pickup elements through the distributed index lens array, the first substrate and the slit-shaped window.

12. The linear array image sensor as claimed in claim 7, wherein said thin-film light emission elements are constituted by organic EL elements.

13. A linear array image sensor with a light source, comprising:

a first substrate made of a transparent plate, said first substrate having a first surface, a second surface and a plurality of side surfaces;

at least one thin-film light emission element disposed on said first surface of the first substrate and linearly elongated in a direction;

a second substrate having two surfaces;

a plurality of solid-state image pickup elements disposed on one of said two surfaces of the second substrate and linearly aligned along said elongated direction of the thin-film light emission element; and a reflector layer for covering at least one of said plurality of side surfaces of the first substrate, said first and second substrates being fixed to and integrated with each other so that light originated by said thin-film light emission element is partially reflected by said reflector layer, emitted from said second surface of said first substrate and reflected by an image carrier to be detected, and that the reflected light is applied to the plurality of the solid-state image pickup elements.

14. The linear array image sensor as claimed in claim 13, wherein said first and second substrates are fixed to and integrated with each other by standing side by side so that said second surface of the first substrate and said one surface of said second substrate are substantially in a plane.

15. The linear array image sensor as claimed in claim 13, wherein said sensor further comprises a transparent thin plate which is positioned above said first and second substrates and fixed to and integrated with the first and second substrates in parallel by a transparent material.

16. The linear array image sensor as claimed in claim 14, wherein said transparent material is a transparent adhesive inserted between said transparent thin plate and said first and second substrates.

17. The linear array image sensor as claimed in claim 14, wherein said transparent thin plate has a thickness of 50 to 200 μm, and wherein in operation a surface of the image carrier is kept in contact with a surface of said transparent thin plate.

18. The linear array image sensor as claimed in claim 13, wherein said thin-film light emission element is constituted by an organic EL element.

19. A linear array image sensor with a light source, comprising:

a first substrate made of a transparent plate, said first substrate having a first surface, a second surface and a plurality of side surfaces;

at least one thin-film light emission element disposed on said first surface of the first substrate and linearly elongated in a direction;

a second substrate made of a transparent plate, said second substrate having a first surface and a second surface;

a least one light-shield layer disposed on said first surface of the second substrate and linearly extending along said elongated direction of the thin film light emission element, said light-shield layer having a slit-shaped window extending along said elongated direction;

a plurality of solid-state image pickup elements disposed on said light-shield layer and linearly aligned along said elongated direction; and a reflector layer for covering at least one of said plurality of side surfaces of the first substrate, said first and second substrates being fixed to and integrated with each other so that light originated by said thin-film light emission element is partially reflected by said reflector layer, emitted from said second surface of said first substrate, passed through said second substrate and said slit-shaped window of the light-shield layer and reflected by an image carrier to be detected, and that the reflected light is applied to the plurality of the solid-state image pickup elements.

20. The linear array image sensor as claimed in claim 19, wherein said first and second substrates are integrated with each other by fixing said second surface of the first substrate to said second surface of the second substrate.

21. The linear array image sensor as claimed in claim 19, wherein said sensor further comprises a transparent thin plate which is positioned above said second substrate and fixed to and integrated with the second substrate in parallel by a transparent material.

22. The linear array image sensor as claimed in claim 21, wherein said transparent material is a transparent adhesive inserted between said transparent thin plate and said second substrate.

23. The linear array image sensor as claimed in claim 21, wherein said transparent thin plate has a thickness of 50 to 200 µm, and wherein in operation a surface of the image carrier is kept in contact with a surface of said transparent thin plate.

24. The linear array image sensor as claimed in claim 19, wherein said thin-film light emission element is constituted by an organic EL element.

* * * * *